(12) United States Patent
Nakazawa et al.

(10) Patent No.: US 6,864,580 B2
(45) Date of Patent: Mar. 8, 2005

(54) SEMICONDUCTOR DEVICE AND METHOD OF MANUFACTURING THE SAME

(75) Inventors: Shoichiro Nakazawa, Hyogo (JP); Heiji Kobayashi, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 42 days.

(21) Appl. No.: 09/915,567

(22) Filed: Jul. 27, 2001

(65) Prior Publication Data

US 2002/0096769 A1 Jul. 25, 2002

(30) Foreign Application Priority Data

Jan. 25, 2001 (JP) ........................................ 2001-016522

(51) Int. Cl.[7] .......................... H01L 23/48; H01L 23/52; H01L 29/40; H01L 21/4763
(52) U.S. Cl. ...................... 257/758; 257/640; 257/642; 257/750; 257/759; 438/523; 438/622; 438/623
(58) Field of Search ................................. 257/640, 642, 257/750, 758, 759; 438/523, 622, 623

(56) References Cited

U.S. PATENT DOCUMENTS

| | | | | |
|---|---|---|---|---|
| 4,363,696 A | * | 12/1982 | Nagakubo et al. | 438/622 |
| 4,521,682 A | * | 6/1985 | Murakami et al. | 257/35 |
| 4,897,700 A | * | 1/1990 | Nakamura | 257/298 |
| 4,984,200 A | * | 1/1991 | Saitoo et al. | 365/154 |
| 5,126,867 A | * | 6/1992 | Ishiwata | 349/138 |
| 5,277,786 A | * | 1/1994 | Kawakami | 205/124 |
| 5,691,573 A | * | 11/1997 | Avanzino et al. | 257/758 |
| 5,691,782 A | * | 11/1997 | Nishikawa et al. | 349/47 |
| 5,801,443 A | * | 9/1998 | Ohno | 257/758 |
| 5,835,248 A | * | 11/1998 | Hanyu et al. | 359/76 |
| 5,955,786 A | * | 9/1999 | Avanzino et al. | 257/758 |
| 6,048,802 A | * | 4/2000 | Avanzino et al. | 438/763 |
| 6,146,990 A | * | 11/2000 | Sung | 438/622 |
| 6,191,026 B1 | * | 2/2001 | Rana et al. | 438/624 |
| 6,373,136 B2 | * | 4/2002 | Otsuka et al. | 257/758 |
| 2002/0027259 A1 | * | 3/2002 | Ikemasu et al. | 257/499 |

FOREIGN PATENT DOCUMENTS

| | | |
|---|---|---|
| JP | 10-308394 | 11/1998 |
| JP | 11-176936 | 7/1999 |

* cited by examiner

*Primary Examiner*—Amir Zarabian
*Assistant Examiner*—Ida M. Soward
(74) *Attorney, Agent, or Firm*—McDermott Will & Emery LLP (57) ABSTRACT

A semiconductor device having a structure in which no short circuit occurs between plug interconnections even when a void occurs in an insulating layer in a gap between wiring layers and a method of manufacturing the same are attained. The method includes: a step of forming transfer gates so as to be close to each other with a gap on a semiconductor substrate; a step of burying the gap and covering a wiring layer; a step of opening a contact hole in an insulating layer in the gap portion; a step of depositing a short-circuit preventing insulating film in the contact hole; an etch back step of removing the short-circuit preventing insulating film at least on the bottom of the gap to expose the semiconductor substrate; and a step of forming a plug interconnection.

11 Claims, 10 Drawing Sheets

SEMICONDUCTOR DEVICE AND METHOD OF MANUFACTURING THE SAME

BACKGROUND OF THE INVENTION

1 Field of the Invention

The present invention relates to a semiconductor device and a method of manufacturing the same. More particularly, the invention relates to a semiconductor device and a method of manufacturing the same for making a defect harmless, which inevitably occurs in an insulating layer or the like in a highly integrated semiconductor circuit structure.

2 Description of the Background Art

As a semiconductor device is becoming smaller, it is inevitable that the interval between transfer gates is becoming shorter in a polypad type cell structure in which polypads are formed as electrodes of bit lines. Consequently, the aspect ratio of the gap between transfer gates is becoming higher and the gap is becoming deeper. Usually, a conductive interconnection of a transfer gate is patterned, a nitride film as a covering protection film is formed on the top face and side faces of the conductive interconnection and, further, an insulating layer is formed on the transfer gates so as to bury the gap between the transfer gates.

Figure 15:
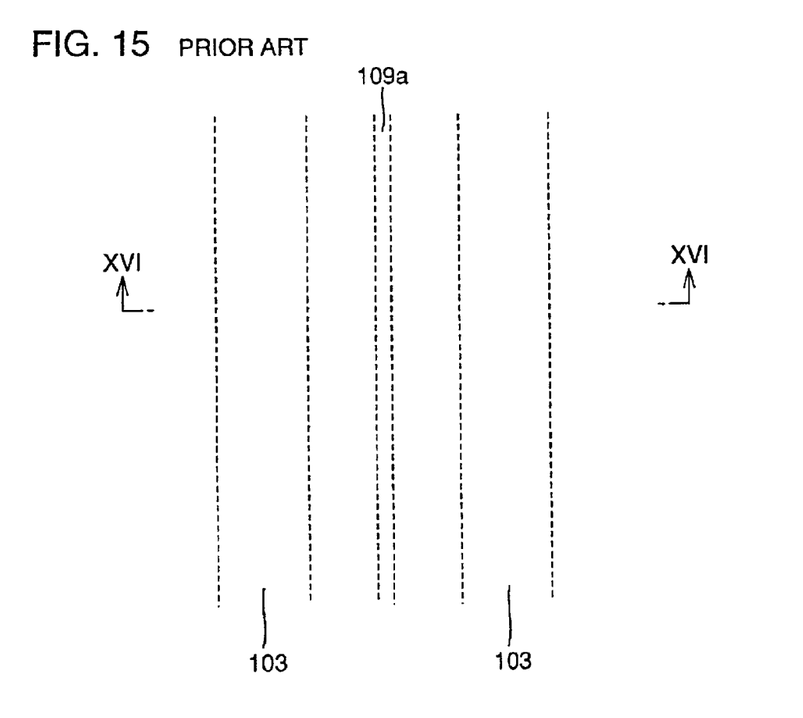
FIG. 15 is a plan view showing transfer gate and a region having the possibility that a void occurs in a conventional DRAM.
Figure 16:
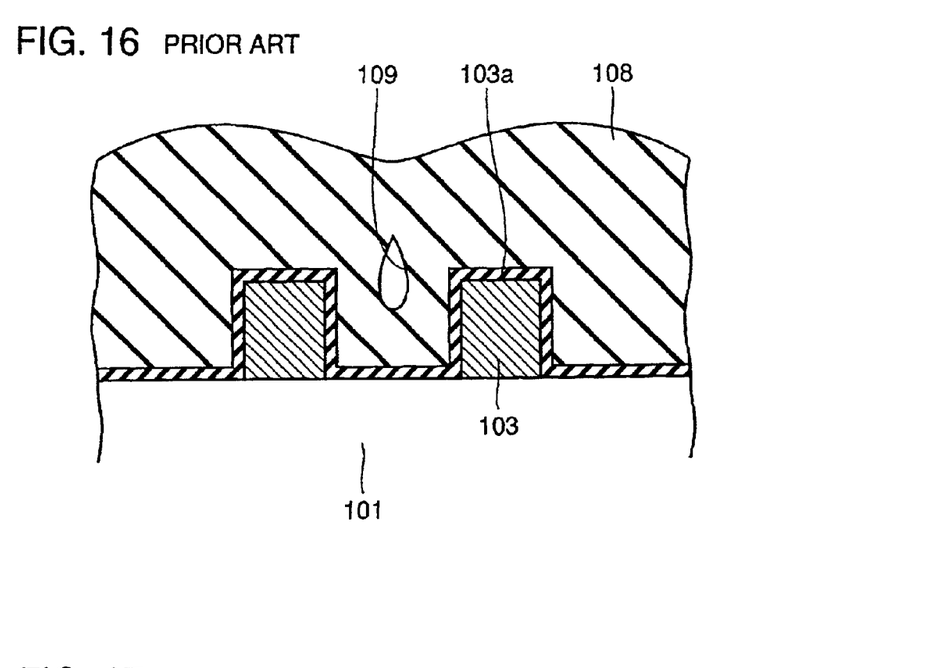
FIG. 16 is a cross section taken along line XVI—XVI of FIG. 15.
Figure 17:
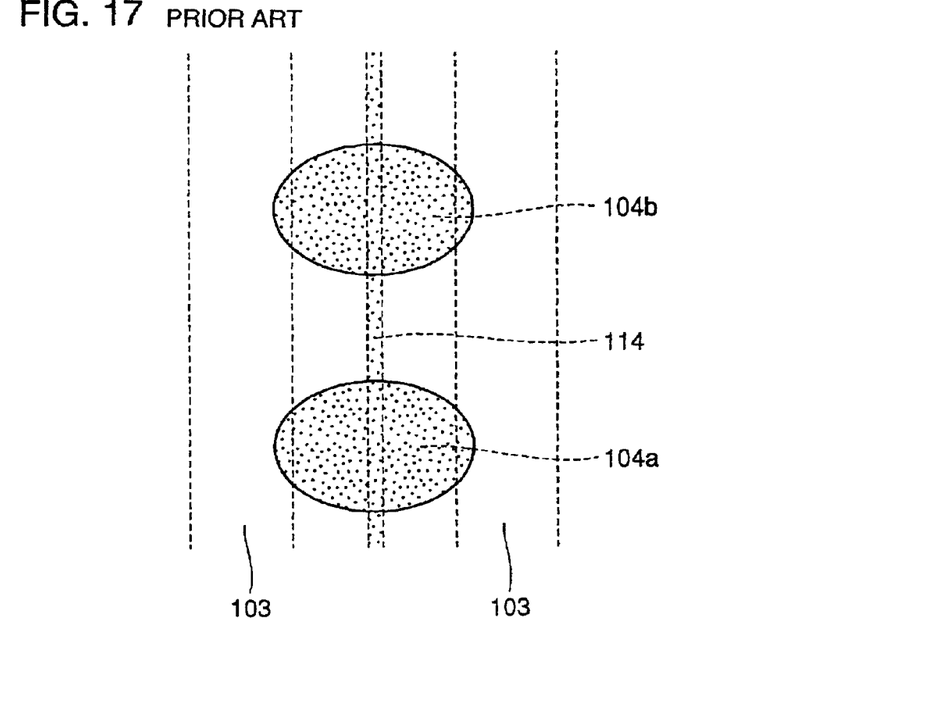
FIG. 17 is a plan view for explaining a short circuit occurring between polypads via a void in the conventional DRAM.

When there is a gap of a high aspect ratio between transfer gates as described above, at the time of forming an insulating layer, the gap between the transfer gates cannot be perfectly buried by the insulating layer. A void which extends long in the longitudinal direction of the transfer gate in a plan view often occurs in the insulating layer. FIG. 15 is a plan view showing arrangement of transfer gates and polypads in a DRAM (Dynamic Random Access Memory). FIG. 16 is a cross section taken along line XVI—XVI of FIG. 15. In FIG. 15, in an insulating interlayer 108 for burying the gap between two transfer gates 103, a region 109a with the high possibility of a void occurrence is extending along the gap. In FIG. 16, reference numeral 101 denotes a semiconductor substrate and reference numeral 103a denotes a nitride protection film. When a void 109 occurs in the region 109a as shown in FIG. 16, polysilicon enters the void at the time of depositing polysilicon for making a polypad, and a short circuit occurs between neighboring polypads 104a and 104b as shown in FIG. 17. In FIG. 17, polysilicon 114 for burying the void is deposited so as to connect the neighboring polypads 104a and 104b. When such a short circuit occurs, the product yield of manufacturing deteriorates. It might cause a delay in deliveries and the like.

SUMMARY OF THE INVENTION

An object of the present invention is to provide a highly integrated semiconductor device having wiring layers arranged so as to be close to each other with a narrow gap, which has a structure that no short circuit occurs between plug interconnections formed with an interval along the gap even when a void occurs in an insulating layer burying the gap, and a method of manufacturing the same.

A method of manufacturing a semiconductor device according to the invention includes: a close wiring layer forming step of forming a plurality of wiring layers in parallel and close to each other with a gap on a base layer which is either a semiconductor layer or a conducting layer; an insulating layer depositing step of depositing an insulating layer covering the wiring layer so as to bury the gap; a contact hole opening step of opening two or more contact holes at an interval in the insulating layer along the longitudinal direction of the gap in a plan view; a short-circuit preventing insulating film depositing step of depositing a short-circuit preventing insulating film in the contact hole; a short-circuit preventing film removing step of removing at least the short-circuit preventing insulating film on the bottom of the contact hole to expose the base layer; and a plug interconnection forming step of forming a plug interconnection in contact with the base layer by using a conductive material so as to bury the contact hole.

According to the manufacturing method, even when a void occurs in an insulating layer in a portion burying the gap and in the peripheral portion of the gap, the short-circuit preventing insulating film enters and blocks the void opened in a side wall of the contact hole. Consequently, a situation such that the neighboring plug interconnections are made conductive can be avoided. A effectively treated gap by this method might possibly have an aspect ratio which is high enough to have the possibility that a void occurs during formation of an insulating layer.

In the method of manufacturing a semiconductor device according to the invention, preferably, the close wiring layer forming step includes a covering insulating film forming step of forming a covering insulating film covering each of wiring layers formed on the base layer and the base layer in the gap.

For example, also in the case where a polypad is formed in a predetermined position between neighboring transfer gates, the manufacturing method can prevent occurrence of a short circuit between the neighboring transfer gates with reliability.

In the method of manufacturing a semiconductor device according to the invention, for example, in the contact hole opening step, a contact hole can be opened so as to reach the covering insulating film which covers the base layer of the bottom of the gap formed in the covering insulating film forming step.

According to the configuration, before removing the covering insulating film covering the wiring layer, a void is closed by depositing the short-circuit preventing insulating film, and the covering insulating film and the short-circuit preventing insulating film on the bottom of the gap can be, for example, etched back at once in the short-circuit preventing insulating removing step. As a result, the manufacturing efficiency can be raised.

In the method of manufacturing a semiconductor device according to the invention, for example, the contact hole opening step may include a covering insulating film removing step of removing the covering insulating film covering the base layer of the bottom of the gap to expose the base layer.

According to the configuration, in the covering insulating film removing step after depositing the short-circuit preventing insulating film, it is sufficient to remove only the short-circuit preventing insulating film. The short-circuit preventing insulating film closing the void may not be removed so much, and the process can shift to the plug interconnection forming step. Consequently, the prevention of a short circuit can be assured more reliably. The covering insulating film removing step may be a continuation of the step of opening a contact hole in the insulating layer in the contact hole opening step. The covering insulating film removing step may be a step of performing an etching process, separated from the contact hole opening step.

In the method of manufacturing a semiconductor device according to the invention, for example, in the short-circuit preventing insulating film depositing step, at least one of a silicon nitride film and a silicon oxide film is deposited by CVD (Chemical Vapor Deposition).

By the CVD, the short-circuit preventing insulating film can be deposited to the deep inside of a void which cannot be seen from the opening of the void. The void can be certainly buried and closed. Thus, a short circuit between plug interconnections can be prevented with higher reliability.

In the method of manufacturing a semiconductor device according to the invention, for example, the conductive material is preferably polysilicon containing an impurity. Polysilicon containing an impurity is a material of which processing method and properties are well known, so that the plug interconnection can be stably, easily formed with high reproducibility.

In the method of manufacturing a semiconductor device according to the invention, for example, the plurality of wiring layers are a transfer gate as a word line, and the plug interconnection is a polypad which connects the base layer and a bit line.

According to the configuration, a polypad of a memory chip such as DRAM, SRAM, or flash memory and a logic chip such as CPU or MPU can be formed without causing a short circuit. As a result, the reliability of a semiconductor device can be increased, and improved manufacturing yield can be realized.

A semiconductor device of the invention includes: a plurality of wiring layers disposed in parallel so as to be close to each other with a gap on a base layer which is either a semiconductor layer or a conductive layer; an insulating layer disposed so as to bury the gap and cover the wiring layers; and two or more plug interconnections made of a conductive material reaching the base layer, which are disposed at an interval in a part of the insulating layer along the longitudinal direction of the gap in a plan view, and a short-circuit preventing insulating film different from the insulating layer is provided between the plug interconnection and the insulating layer.

According to the configuration, in a semiconductor device inevitably including the structure accompanying a gap having the possibility that a void occurs, even when a void occurs along the longitudinal direction of the gap in the insulating layer of the gap portion of the peripheral portion of the gap, occurrence of a short circuit between the plug interconnections can be prevented. Consequently, the reliability of the semiconductor device can be raised, and improved manufacturing yield can be realized. A effectively treated gap might possibly have an aspect ratio which is high enough to have the possibility that a void occurs during formation of an insulating layer. The short-circuit preventing insulating film disposed between the plug interconnection and the insulating layer does not have to cover all of the plug interconnection. As long as the short-circuit preventing insulating film is positioned partly between the plug interconnection and the insulating layer, it corresponds to the means of the invention. Even if a part of plug interconnections has the adjoining short-circuit preventing insulating film between the insulating layer and plug interconnection itself, it corresponds to the means of the invention.

In the semiconductor device according to the invention, preferably, the short-circuit preventing insulating film enters a void occurring in a portion which buries the gap in the insulating layer.

When the short-circuit preventing insulating film enters a void, the void can be electrically blocked, so that the reliability of preventing a short circuit between the plug interconnections can be increased. A void occurs not necessarily through the plug interconnections but may have a part which is open in the contact hole for plug interconnection. When the void has a part which is open in the contact hole even a little, the short-circuit preventing insulating film can enter the open part. Not every plug interconnection has to have a void in which the short-circuit preventing insulating film entering from the opening is formed. When a part of the plug interconnections has a void in which the short-circuit preventing insulating film entering from the opening is formed, the plug interconnection corresponds to a means of the invention.

In the semiconductor device of the invention, the short-circuit preventing insulating film is at least one of a silicon nitride film and a silicon oxide film.

By using the short-circuit preventing insulating films which are not expensive, in a semiconductor device inevitably having an interconnection structure including a gap of a high aspect ratio having the high risk of occurrence of a void, a short circuit between plug interconnections caused by a void can be prevented.

In the semiconductor device according to the invention, preferably, the conductive material is polysilicon containing an impurity.

By the configuration, for example, a cheap semiconductor device in which a bit line and a base layer can be connected to each other with reliability can be obtained.

In the semiconductor device according to the invention, for example, the plurality of wiring layers are a transfer gate serving as a word line, and the plug interconnection is a polypad connecting the base layer and a bit line.

By the configuration, a memory chip such as DRAM or flash memory and a logic chip such as CPU or MPU each including a gap of a high aspect ratio having the risk of occurrence of a void can be manufactured without causing a short circuit which occurs via a void. As a result, the reliability of the semiconductor device can be increased and improved manufacturing yield can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described with reference to the drawings.

First Embodiment

Figure 1:
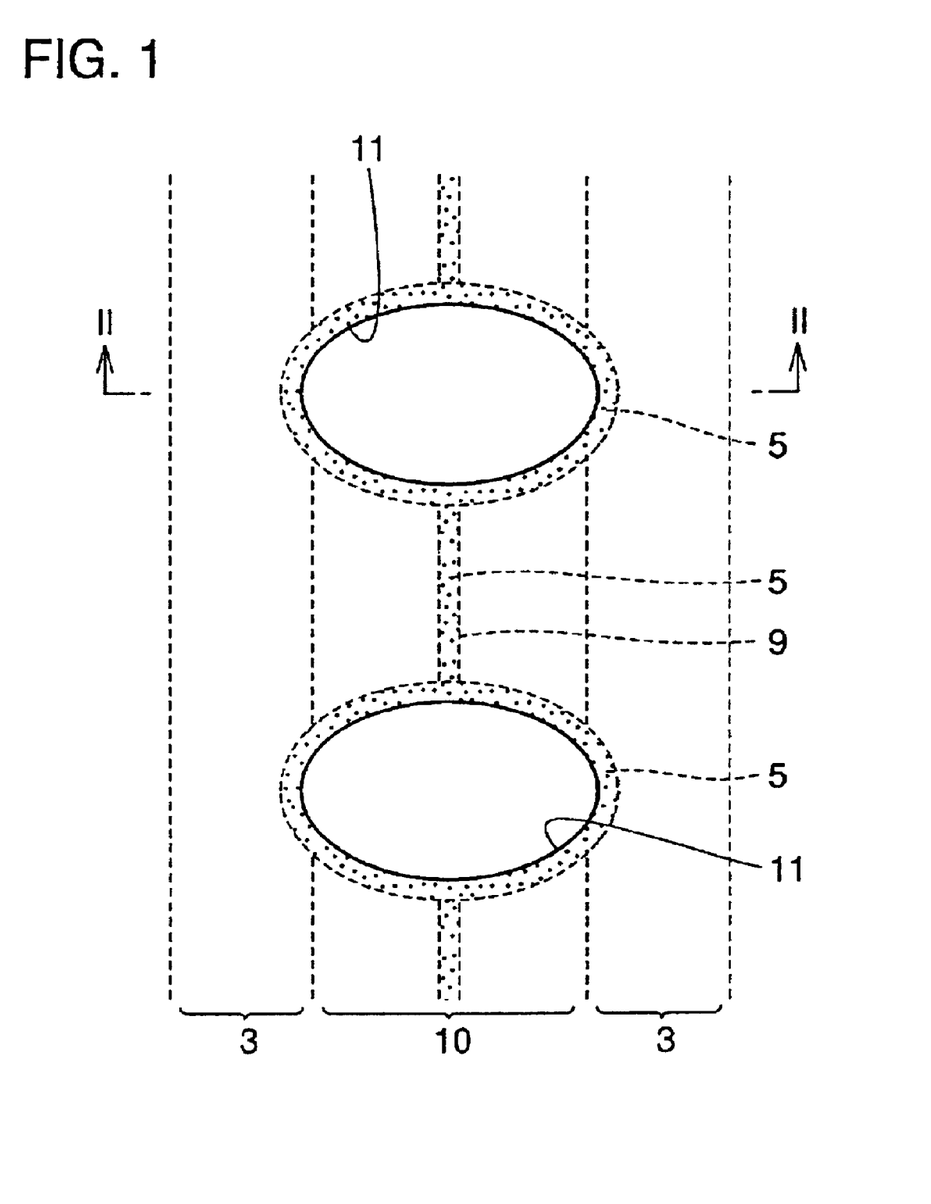
FIG. 1 is a plan view showing a step where a short-circuit preventing insulating film is deposited on the inside of contact holes in a method of manufacturing a semiconductor device according to a first embodiment of the invention.
Figure 2:
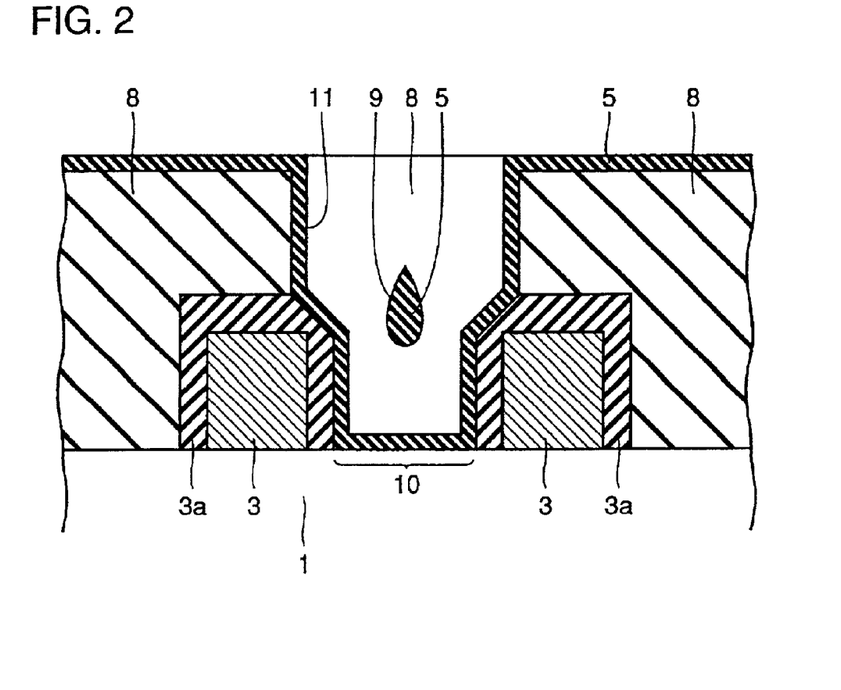
FIG. 2 is a cross section taken along line II—II of FIG. 1.

In FIGS. 1 and 2, two lines of transfer gates 3 are formed with a gap 10 therebetween on a semiconductor substrate 1. The side faces and the top face of each of the transfer gates 3 are covered with a covering insulating film 3a. Although the semiconductor substrate on the bottom of the gap 10 is also covered with the covering insulating film 3a, the covering insulating film 3a is removed on the bottom of a contact hole shown in FIG. 2. An insulating layer 8 is formed to cover the transfer gates 3 so as to bury the gap 10. Contact holes 11 are opened in the insulating film 8 at an interval in the longitudinal direction of the gap 10 to form polypads.

A void 9 as an issue in the invention occurs in the longitudinal direction of the gap 10 in the insulating layer 8 covering the gap in a plan view. The void 9 therefore extends perpendicular to the drawing sheet in FIG. 2. When a contact hole 11 is formed in a predetermined position between the transfer gates 3 to form a polypad, the void 9 appears as an opening in the wall of the insulating layer 8 of the contact hole 11. When the contact hole is filled with polysilicon to form a polypad like in a conventional manner, the polysilicon is deposited also in the void. Neighboring polypads are made conductive via the polysilicon deposited in the void, and it causes a short circuit.

Consequently, as shown in FIGS. 1 and 2, after opening the contact hole 11, a nitride film 5 as a short-circuit preventing insulating film is deposited on the surfaces of the side walls of the insulating layer 8 and the transfer gates 3 by CVD (Chemical Vapor Deposition). The nitride film 5 enters also the void to interrupt the contact between the neighboring contact holes. By depositing the nitride film as a short-circuit preventing insulating film by the CVD, a gas component of the short-circuit preventing insulating film also reaches the deep portion which cannot be seen from the opening of the void, and a film is deposited there. Consequently, the contact holes can be closed with reliability.

Figure 3:
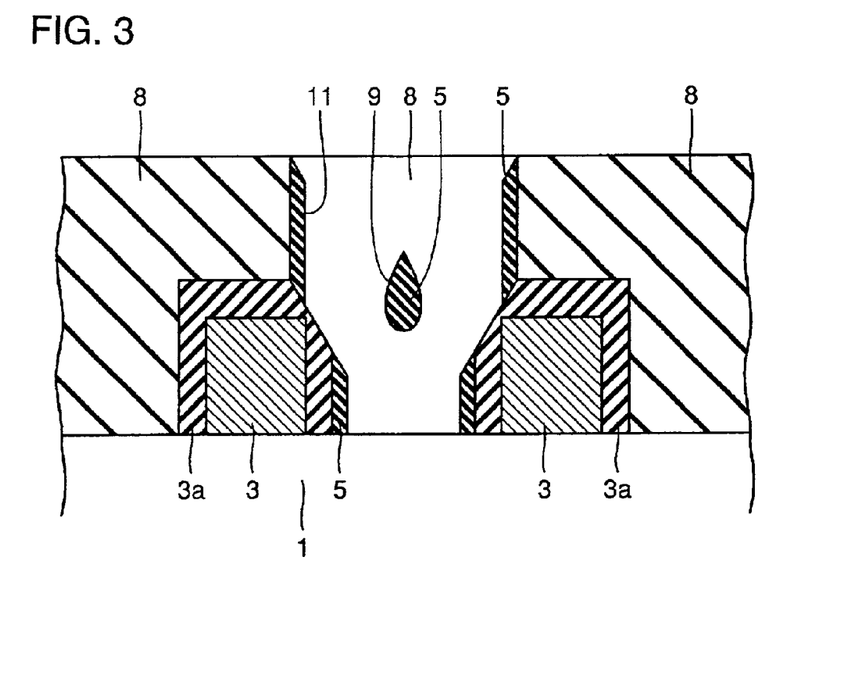
FIG. 3 is a cross section showing a step where a semiconductor substrate is exposed by performing etch back in the state of FIGS. 1 and 2.

Further, as shown in FIG. 3, the nitride film 5 on the shoulder portions of the side faces of the transfer gate and on the bottom of the gap 10 are etched back. By the etch back, the excessive nitride film 5 is removed, and the contact between the plug interconnection filling the contact hole and the semiconductor substrate 1 can be assured.

Figure 4:
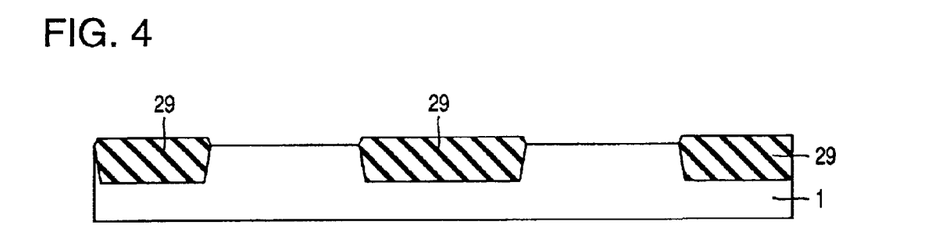
FIG. 4 is a cross section showing a step in which a device isolation insulating band is provided on the semiconductor substrate and an impurity is implanted to form a well in the method of manufacturing the semiconductor device in the first embodiment of the invention.
Figure 5:
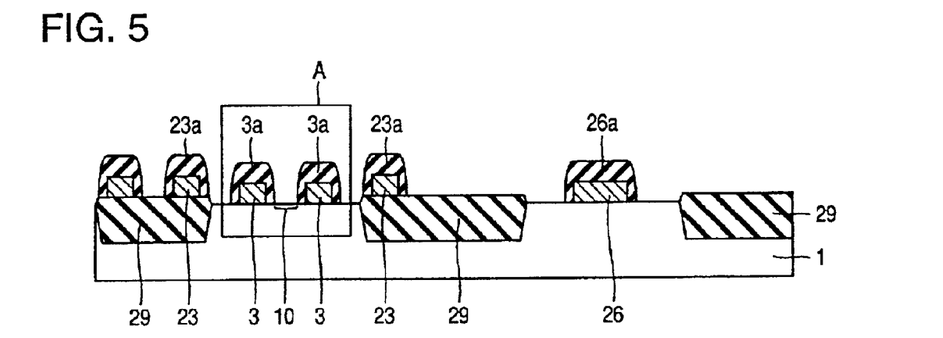
FIG. 5 is a cross section showing a step in which transfer gates as word lines are formed in the state of FIG. 4.

The processes in the steps of FIGS. 1 to 3 and the following processes will now be described. FIG. 4 is a cross section showing a step where device isolation bands 29 are formed in the surface of the semiconductor substrate 1, and impurities are implanted to the region between the device isolation bands 29 to form a well (not shown). As shown in FIG. 5, transfer gates 3, 23, and 26 as word lines extending perpendicular to the drawing sheet are formed. Each transfer gate is constructed by a conductive layer portion, and a covering insulating film (3a, 23a, and 26a) covering the top face and side faces of the transfer gate. Further, impurities are implanted to form a channel (not shown).

Figure 6:
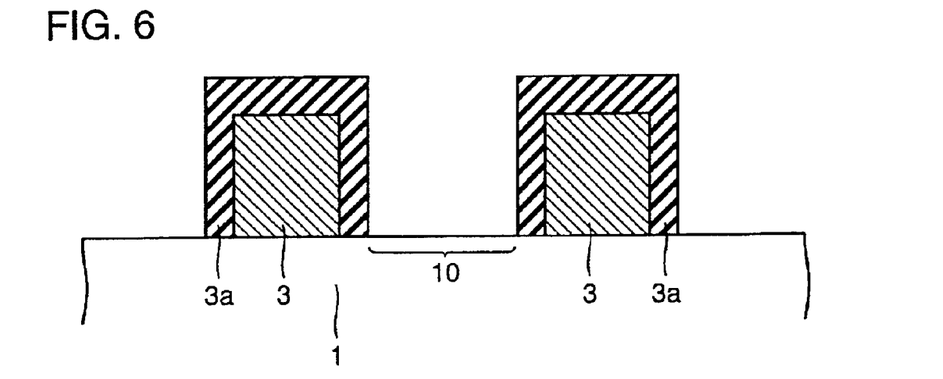
FIG. 6 is an enlarged view of the portion A in FIG. 5.
Figure 7:
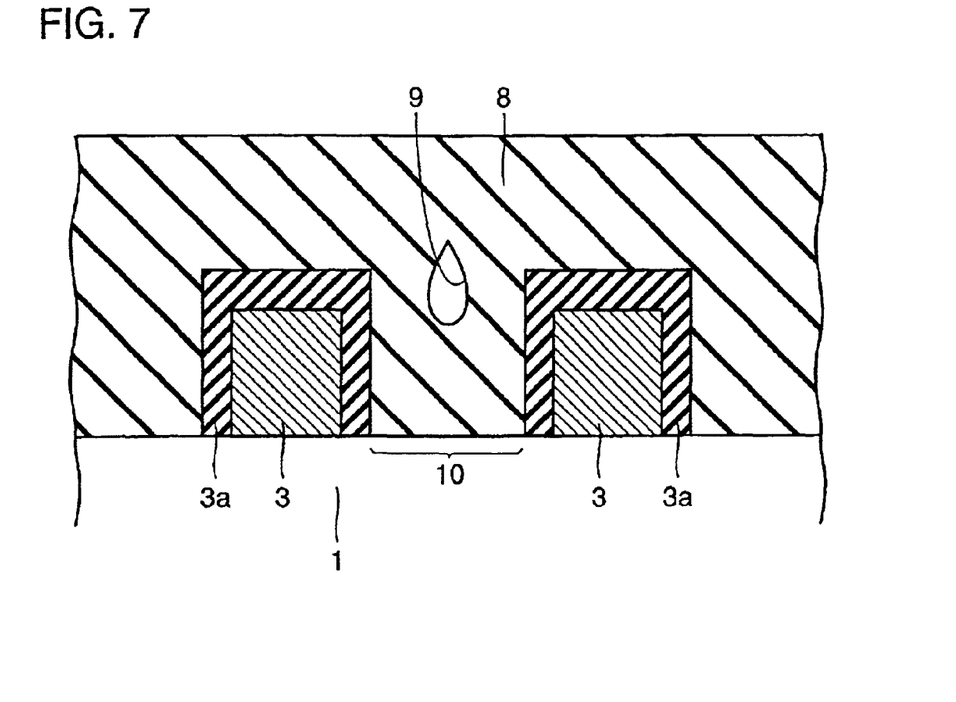
FIG. 7 is a cross section showing a step in which an insulating film is deposited in the state of FIG. 6.
Figure 8:
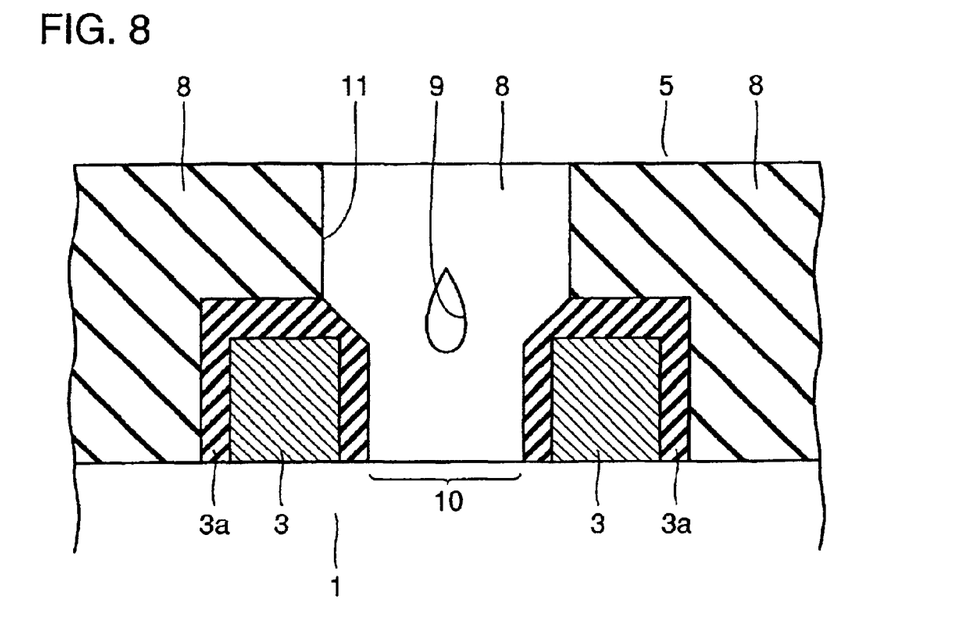
FIG. 8 is a cross section showing a step in which a contact hole for a polypad is formed in the state of FIG. 7.

FIG. 6 is an enlarged diagram of the A portion in FIG. 5. An insulating layer 8 is deposited in the state of FIG. 6. As shown in FIG. 7, the void 9 occurs in the insulting film 8 in the part of the gap 10. Subsequently, when the contact hole 11 for a polypad is opened, as shown in FIG. 8, the cross section of the void 9 appears in a side wall of the contact hole 11.

After that, as shown in FIGS. 1 and 2, the nitride film 5 as a short-circuit preventing insulating film is formed in the contact hole 11 and, as shown in FIG. 3, the nitride film 5 is etched back. As described above, the processing steps of FIGS. 1 to 3 are the essence of the invention.

Figure 9:
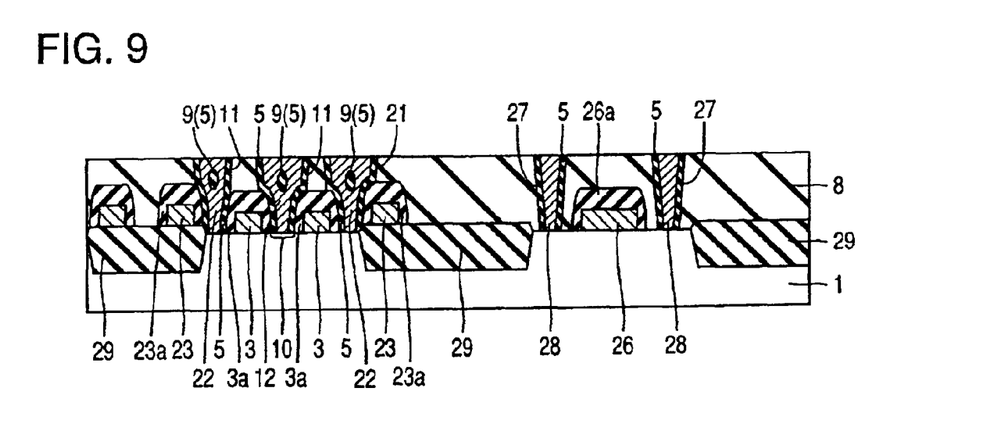
FIG. 9 is a cross section showing a step in which a plug interconnection (polypad) is formed after the etch back in FIG. 3.
Figure 10:
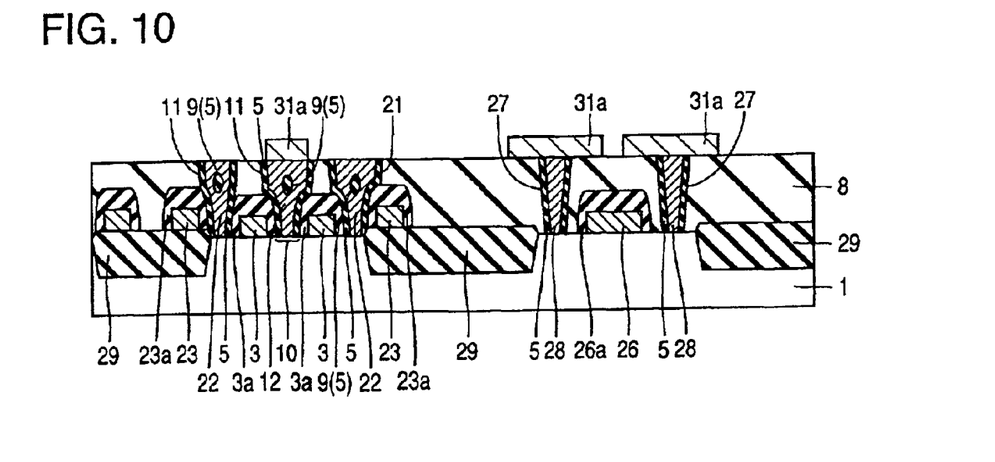
FIG. 10 is a cross section showing a step in which a bit line is formed in the state of FIG. 9.

As shown in FIG. 9, polysilicon is deposited so as to bury contact holes 11, 21, and 27 to thereby form plug interconnections. The plug interconnections are polypads 12, 22, and 28 each connecting a bit line and the semiconductor substrate. As shown in FIG. 10, bit lines 31 to be connected to the polypads on the insulating layer 8 are formed. After that, an insulating layer 38 is deposited and a storage node contact 32 which is in contact with a storage node constructing a capacitor for storing bit information is formed (refer to FIG. 11). Subsequently, an insulating layer 39 is deposited, a contact hole is opened, and a storage node is formed. The storage node is constructed by a lower layer electrode 33 in contact with the storage node contact 32, a dielectric layer 34 on the lower layer electrode 33, and an upper layer electrode 35 on the dielectric layer 34. The upper layer electrode 35 is connected to a wiring layer 36 on the insulating layer 39.

Figure 12:
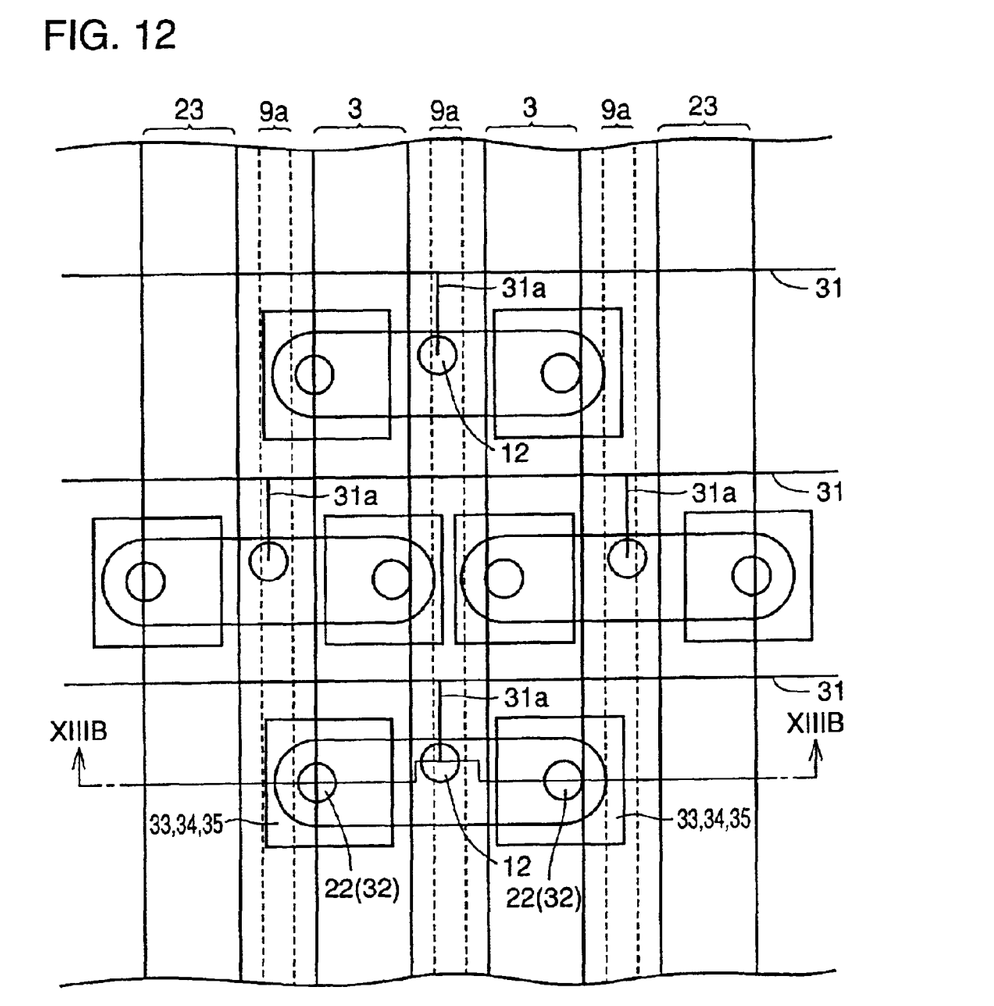
FIG. 12 is a partial plan view showing arrangement of word lines and bit lines in the DRAM in the first embodiment.

FIG. 12 is a plan view of a DRAM formed as described above. The transfer gates 3 and 23 as word lines extend in the vertical direction of the drawing sheet, and bit lines 31 extend in the lateral direction of the drawing sheet so as to perpendicularly cross the transfer gates. The bit line has a width like a transfer gate but is expressed as a line for simplicity of the drawing. In the gaps between the transfer gates 3 and 23, regions 9a having the high possibility of occurrence of a void extend in parallel with the transfer gates. In FIG. 12, there is the possibility that a polypad 12 is short-circuited with a polypad neighboring in the region 9a every other bit line via a void. In FIG. 1, a region between the two polypads which may be short-circuited is not shown.

Figure 13:
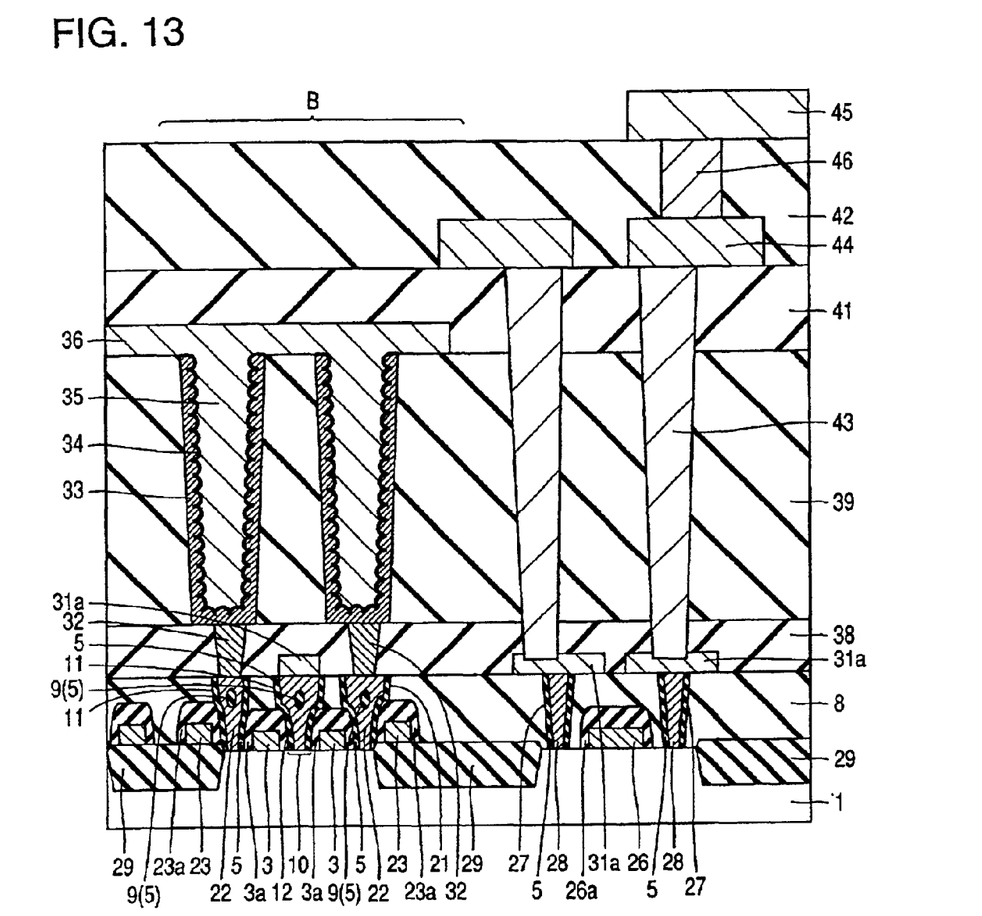
FIG. 13 is a cross section showing the outline of the DRAM in the first embodiment including a cross section taken along line XIIIB—XIIIB of FIG. 12.

FIG. 13 is a cross section including a portion B corresponding to the cross section taken along line XIIIB—XIIIB of FIG. 12. In FIG. 13, an insulating layer 41 is further deposited in the state of FIG. 12. A metal interconnection contact 43 is formed in the insulating layer 41, and a first metal interconnection 44 is formed on the metal wiring contact 43. Further, an insulating layer 42 is formed so as to cover the first metal interconnection 44. Subsequently, a contact 46 between the metal interconnections is formed, and a second metal interconnection 45 is formed, thereby forming an electrode of a DRAM.

Figure 11:
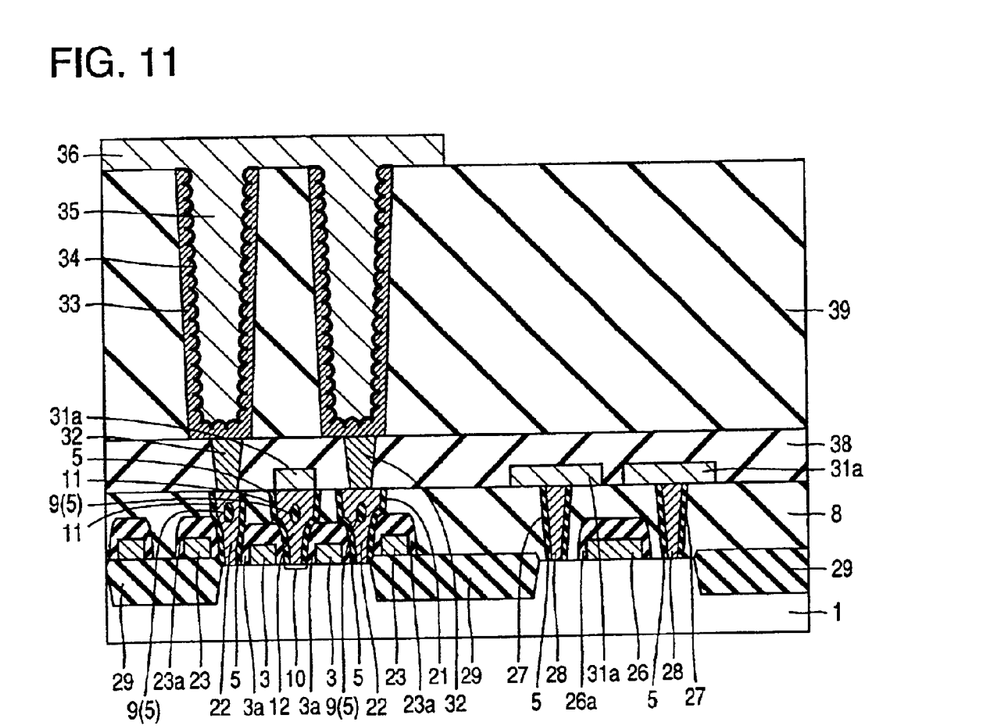
FIG. 11 is a cross section showing a step in which an insulating layer is deposited in the state of FIG. 10, a storage node contact is formed, and an insulating layer is deposited on the storage node contact, thereby forming a storage node for storing bit information.

As described above, in the embodiment, by the short-circuit preventing insulting film depositing step and the etch back step, in the void, the neighboring polypads are separated from each other by the nitride. Consequently, even when a polypad is formed by depositing polysilicon later, insulation is maintained, and no short circuit occurs between the polypads. In the short-circuit preventing process in the embodiment, only the process of covering the inner face of the contact hole 11 with the nitride film 5 and etching back the nitride film 5 is added. Therefore, a short circuit between polypads can be easily and certainly prevented.

Second Embodiment

Figure 14:
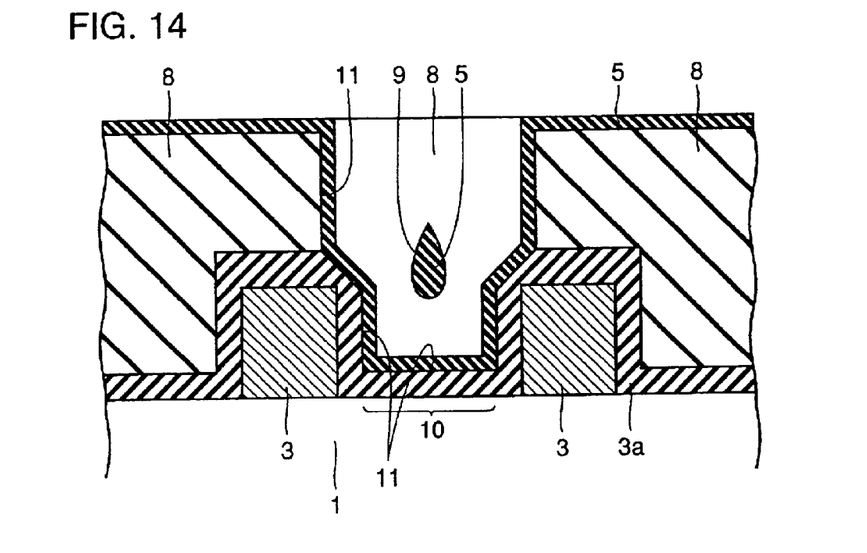
FIG. 14 is a plan view showing a step in which a short-circuit preventing insulating film is formed on the inside of a contact hole in a method of manufacturing a DRAM according to a second embodiment of the invention.

In a second embodiment, after depositing the insulating layer 8, in a contact hole opening process for forming a polypad, the contact hole is not opened so deep to reach the semiconductor substrate but is stopped when it reaches the covering insulating film 3a. At this time point, the opening of the void 9 is exposed in a side wall of the contact hole 11 (refer to FIG. 14). Subsequently, as shown in FIG. 14, the short-circuit preventing insulating film 5 is deposited on the surface of the contact hole 11 to bury the void, thereby disconnecting the neighboring polypads. After that, the nitride film 5 and the covering insulating film 3a on the bottom of the contact hole 11 are etched back to expose the semiconductor substrate in the portion of the gap 10. In the case of forming a plug interconnection for connecting a bit line and a semiconductor substrate after that, since the void is buried by the short-circuit preventing insulating film, no short circuit occurs between neighboring plug interconnections via the void.

In the embodiment, the covering insulating film for covering a conductive layer of a transfer gate and the short-circuit preventing insulating film are removed together at the time of etch back, so that it becomes unnecessary to strictly control the ending time point in the contact hole opening step. In the process of etch back to the semiconductor substrate, since the film to be etched is thin, the control at the time of ending the etch back does not need high accuracy so much. Consequently, the semiconductor device can be fabricated efficiently at high yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of wiring layers disposed in parallel so as to be close to each other with a gap on a base layer which is either a semiconductor layer or a conductive layer;
   an insulating layer disposed so as to bury said gap and cover said wiring layers; and
   two or more plug interconnections made of a conductive material reaching said base layer, which are disposed at an interval in a part of said insulating layer along the longitudinal direction of said gap in a plan view,
   wherein a short-circuit preventing insulating film different from said insulating layer is provided between said plug interconnection and said insulating layer.

2. The semiconductor device according to claim 1, wherein said short-circuit preventing insulating film enters a void occurring in a portion which buries said gap in said insulating layer.

3. The semiconductor device according to claim 1, wherein said short-circuit preventing insulating film is at least one of a silicon nitride film and a silicon oxide film.

4. The semiconductor device according to claim 1, wherein said conductive material is polysilicon containing an impurity.

5. The semiconductor device according to claim 1, wherein said plurality of wiring layers are a transfer gate serving as a word line, and said plug interconnection is a polypad connecting said base layer and a bit line.

6. A method of manufacturing a semiconductor device, comprising:
   a close wiring layer forming step of forming a plurality of wiring layers in parallel and close to each other with a gap between neighboring wiring layers on a base layer which is either a semiconductor layer or a conducting layer;
   an insulating layer depositing step of depositing an insulating layer covering said wiring layer so as to bury said gap;
   a contact hole opening step of opening two or more contact holes at an interval in said insulating layer along the longitudinal direction of said gap in a plan view;
   a short-circuit preventing insulating film depositing step of depositing a short-circuit preventing insulating film in said contact hole;
   a short-circuit preventing film removing step of removing at least said short-circuit preventing insulating film on the bottom of said contact hole to expose said base layer; and
   a plug interconnection forming step of forming a plug interconnection in contact with said base layer by using a conductive material so as to bury said contact hole.

7. The method of manufacturing a semiconductor device according to claim 6, wherein said close wiring layer forming step includes a covering insulating film forming step of forming a covering insulating film covering each of wiring layers formed on said base layer and the base layer in said gap.

8. The method of manufacturing a semiconductor device according to claim 7, wherein in said contact hole opening step, a contact hole is opened so as to reach the covering insulating film which covers said base layer of the bottom of said gap formed in said covering insulating film forming step.

9. The method of manufacturing a semiconductor device according to claim 7, wherein said contact hole opening step includes a covering insulating film removing step of removing the covering insulating film covering said base layer of the bottom of said gap to expose said base layer.

10. The method of manufacturing a semiconductor device according to claim 6, wherein in said short-circuit preventing insulating film depositing step, at least one of a silicon nitride film and a silicon oxide film is deposited by CVD.

11. The method of manufacturing a semiconductor device according to claim 6, wherein said plurality of wiring layers are a transfer gate as a word line, and said plug interconnection is a polypad which connects said base layer and a bit line.

* * * * *